(12) United States Patent
Shimizu

(10) Patent No.: US 10,256,807 B2
(45) Date of Patent: Apr. 9, 2019

(54) DRIVING DEVICE FOR SEMICONDUCTOR ELEMENTS

(71) Applicant: FUJI ELECTRIC CO., LTD., Kawasaki (JP)

(72) Inventor: Naoki Shimizu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/899,639

(22) Filed: Feb. 20, 2018

(65) Prior Publication Data

US 2018/0175849 A1   Jun. 21, 2018

Related U.S. Application Data

(63) Continuation of application No. PCT/JP2017/003192, filed on Jan. 30, 2017.

(30) Foreign Application Priority Data

Mar. 4, 2016   (JP) .................................. 2016-042239

(51) Int. Cl.
*H03K 17/14* (2006.01)
*H03K 17/28* (2006.01)
(Continued)

(52) U.S. Cl.
CPC .............. *H03K 17/14* (2013.01); *H02M 1/08* (2013.01); *H03K 17/18* (2013.01); *H03K 17/28* (2013.01);
(Continued)

(58) Field of Classification Search
CPC ........ H03K 17/14; H03K 17/18; H03K 17/28; H03K 17/56; H03K 17/567; H02M 1/08
(Continued)

(56) References Cited

U.S. PATENT DOCUMENTS 6,351,107 B1   2/2002   Okita
6,838,914 B2   1/2005   Sakata et al.
(Continued)

FOREIGN PATENT DOCUMENTS

JP   2001-78435   3/2001
JP   2005-348429   12/2005
(Continued)

OTHER PUBLICATIONS

International Search Report dated Apr. 25, 2017 in corresponding International Patent Application No. PCT/JP2017/003192.
(Continued)

*Primary Examiner* — Thomas Skibinski

(57) ABSTRACT

To provide a driving device for semiconductor elements that is capable of suppressing variation in switching time caused by driving capability and temperature. A driving device for semiconductor elements includes: a semiconductor chip in which a voltage control type semiconductor element is formed; a temperature detecting unit configured to detect temperature of the semiconductor chip; a driving-capability adjusting unit configured to adjust driving capability of the voltage control type semiconductor element according to temperature detection values detected by the temperature detecting unit; and a timing adjusting unit configured to adjust switching time of the voltage control type semiconductor element according to the temperature detection values detected by the temperature detecting unit.

7 Claims, 7 Drawing Sheets

(51) Int. Cl.
*H03K 17/56* (2006.01)
*H02M 1/08* (2006.01)
*H03K 17/18* (2006.01)
*H03K 17/567* (2006.01)
*H03K 17/08* (2006.01)

(52) U.S. Cl.
CPC ........... *H03K 17/56* (2013.01); *H03K 17/567* (2013.01); *H03K 2017/0806* (2013.01)

(58) Field of Classification Search
USPC ........ 327/108–112, 427, 434, 437, 262, 378, 327/512, 513; 326/82, 83, 87
See application file for complete search history.

(56) References Cited

U.S. PATENT DOCUMENTS

| | | |
|---|---|---|
| 7,132,868 B2 | 11/2006 | Sakata et al. |
| 7,274,223 B2 | 9/2007 | Sakata et al. |
| 8,970,259 B2 | 3/2015 | Mori |
| 9,337,816 B2 | 5/2016 | Fujii |
| 9,608,618 B2 | 3/2017 | Sakai et al. |
| 2003/0001630 A1 | 1/2003 | Sakata et al. |
| 2003/0206039 A1 | 11/2003 | Sakata et al. |
| 2003/0206040 A1 | 11/2003 | Sakata et al. |
| 2012/0242346 A1 | 9/2012 | Wang et al. |
| 2013/0285732 A1* | 10/2013 | Mori ................... H03K 17/145 327/378 |
| 2015/0214938 A1 | 7/2015 | Fujii |
| 2015/0358013 A1 | 12/2015 | Sakai et al. |

FOREIGN PATENT DOCUMENTS

| | | |
|---|---|---|
| JP | 2011-82764 | 4/2011 |
| JP | 2012-222681 | 11/2012 |
| JP | 2013-219633 | 10/2013 |
| JP | 5700095 | 2/2015 |
| JP | 2015-142169 | 8/2015 |
| WO | WO 2014/123046 A1 | 8/2014 |

OTHER PUBLICATIONS

English translation of International Preliminary Report on Patentability dated Sep. 13, 2018 from International Patent Application No. PCTJP2017/003192, 7 pages.

* cited by examiner

FIG. 2
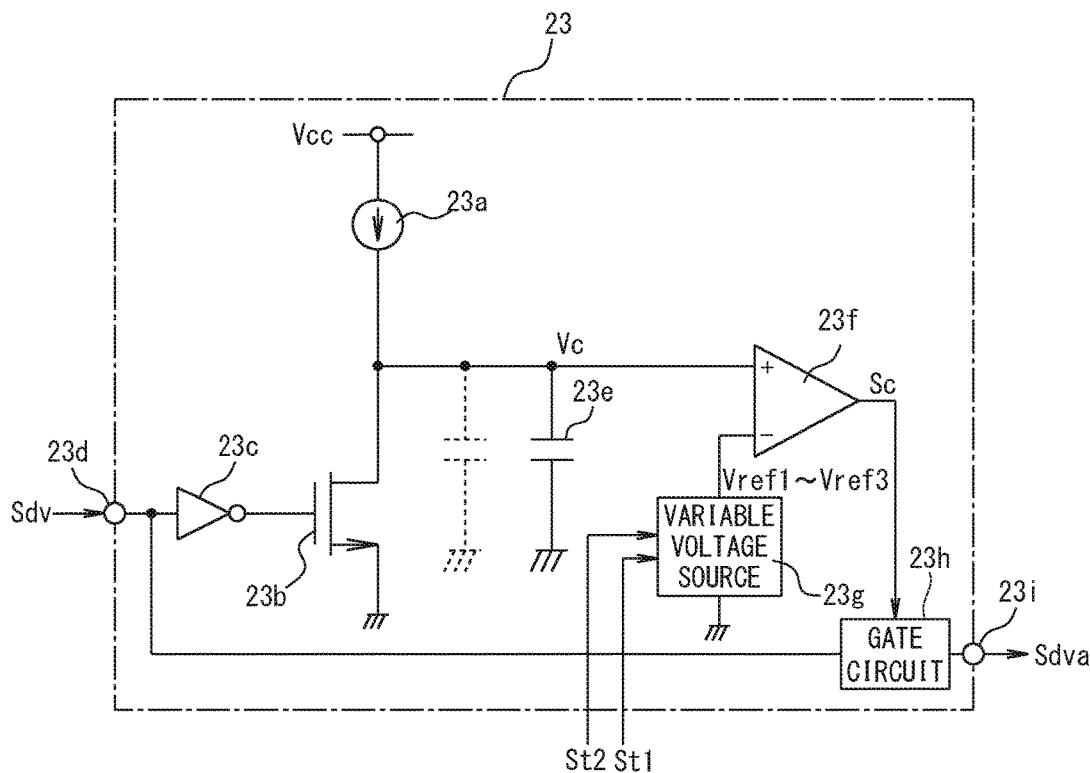
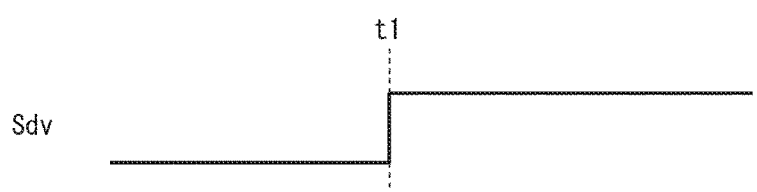
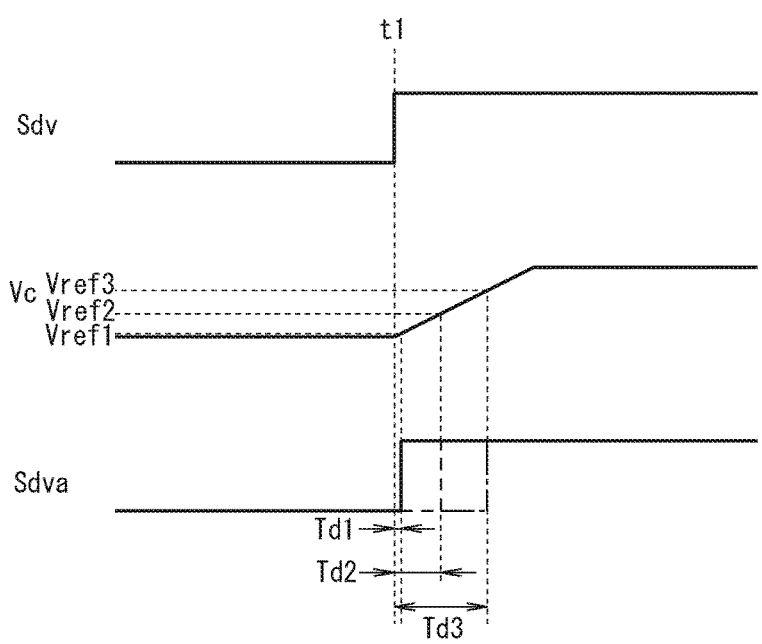

DRIVING DEVICE FOR SEMICONDUCTOR ELEMENTS

CROSS REFERENCE TO RELATED APPLICATIONS AND INCORPORATION BY REFERENCE

This application is a continuation application filed under 35 U.S.C. § 111(a) of International Patent Application No. PCT/JP2017/003192, filed Jan. 30, 2017, which claims the foreign priority benefit under 35 U.S.C. § 119 of Japanese Patent Application No. JP2016-042239, filed Mar. 4, 2016, the contents of which are incorporated herein by reference.

TECHNICAL FIELD

The present invention relates to a driving device for semiconductor elements that drives, for example, a voltage-driven type semiconductor element to perform a switching operation.

BACKGROUND ART

As a driving device for semiconductor elements of this type, for example, a configuration disclosed in PTL 1 has been known.

The conventional example disclosed in PTL 1 is configured to incorporate a temperature detecting Zener diode in a semiconductor substrate identical to a semiconductor substrate in which an IGBT is fabricated, to connect the anode of the temperature detecting Zener diode to a constant current source, to connect the cathode thereof to GND, to compare voltage at a connection point between the constant current source and the temperature detecting Zener diode with a reference voltage, to control current supplied to the gate of the IGBT, based on a result of the comparison, and to change driving capability to drive the IGBT according to detected temperature.

CITATION LIST

Patent Literature

PTL 1: JP 2013-219633 A

SUMMARY OF INVENTION

Technical Problem

Since the conventional example disclosed in the above-described PTL 1 is configured to detect the temperature of the semiconductor substrate in which the IGBT is fabricated and switch the driving capability to drive a power transistor, the turn-on capability of the power transistor may be improved regardless of variation in the temperature.

However, there is a problem in that, since, due to rise in the driving capability when the driving capability to drive a power transistor is switched, di/dt of current flowing through the high-potential-side terminal of the power transistor increases, switching time of the power transistor shortens. In addition, there is also a problem in that a high temperature at a semiconductor chip in which a power transistor is fabricated causes delay time of IC to also shorten.

Accordingly, the present invention has been made in view of the problems in the conventional example described in the above-described PTL 1, and an object of the present invention is to provide a driving device for semiconductor elements that is capable of suppressing variation in switching time caused by driving capability and temperature.

Solution to Problem

In order to achieve the object mentioned above, according to an aspect of the present invention, there is provided a driving device for semiconductor elements including: a semiconductor chip in which a voltage control type semiconductor element is formed; a temperature detecting unit configured to detect temperature of the semiconductor chip; a driving-capability adjusting unit configured to adjust driving capability of the voltage control type semiconductor element according to temperature detection values detected by the temperature detecting unit; and a timing adjusting unit configured to adjust switching time of the voltage control type semiconductor element according to the temperature detection values detected by the temperature detecting unit.

Advantageous Effects of Invention

One aspect of the present invention enables a driving device for semiconductor elements to be provided that is capable of suppressing variation in switching time of a voltage control type semiconductor element formed in a semiconductor chip caused by driving capability and temperature.

BRIEF DESCRIPTION OF DRAWINGS

FIG. 2 is a circuit diagram illustrative of an example of a timing adjusting unit applicable to the present invention;

FIGS. 3A to 3C are signal waveform charts provided for description of an operation of the timing adjusting unit in FIG. 2;

DESCRIPTION OF EMBODIMENTS

Next, an embodiment of the present invention will now be described with reference to the drawings. In the following description of the drawings, the same or similar reference signs are assigned to the same or similar constituent components.

In addition, the following embodiments exemplify devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Hereinafter, a driving device for semiconductor elements according to one embodiment of the present invention will be described with reference to the drawings.

The present embodiment will be described taking a voltage control type semiconductor element as an example of the semiconductor elements and taking a gate driving device for semiconductor elements as an example of the driving device.

Figure 1:
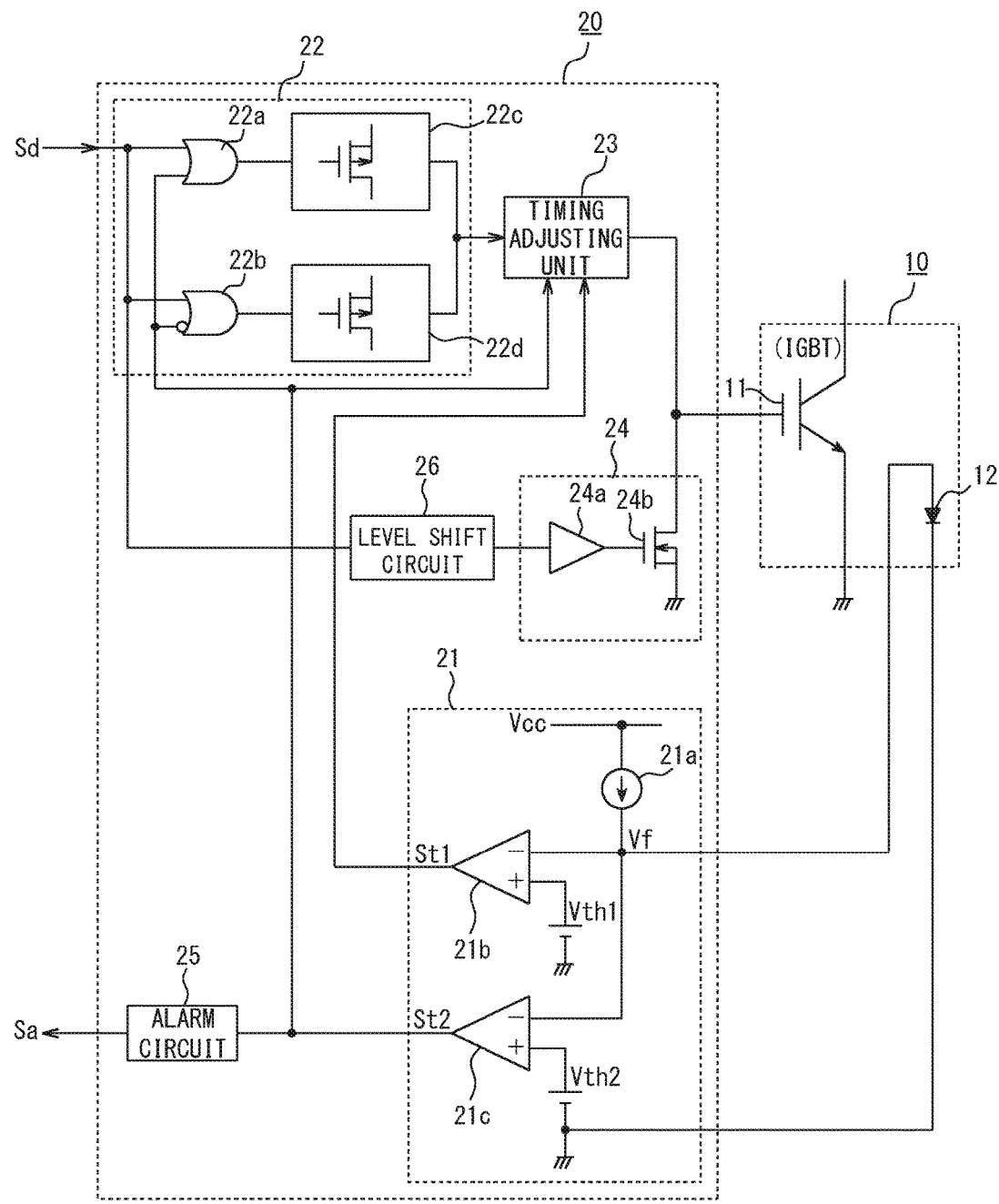
FIG. 1 is a circuit diagram illustrative of a first embodiment of a driving device for semiconductor elements according to the present invention.

First, the gate driving device for semiconductor elements according to the present invention includes, as illustrated in FIG. 1, a semiconductor chip 10 and an IC chip 20.

In a not-illustrated semiconductor substrate of the semiconductor chip 10, an insulated gate bipolar transistor (hereinafter, referred to as an IGBT) 11 as a voltage control type semiconductor element is formed. In the semiconductor substrate of the semiconductor chip 10, a temperature detecting diode 12 as a temperature detecting element for detecting internal temperature of a chip is fabricated in conjunction with the IGBT 11.

The IC chip 20 includes a temperature detecting unit 21 configured to detect anode side voltage Vf of the temperature detecting diode 12 and output a temperature detection signal and a driving-capability adjusting unit 22 configured to, based on the detection signal from the temperature detecting unit 21, adjust driving capability at the time of turning on the IGBT 11. The IC chip 20 also includes a timing adjusting unit 23 configured to adjust switching time at the time of turning on the IGBT 11, a discharging unit 24 configured to turn off the IGBT 11, and an alarm circuit 25 configured to generate an alarm signal.

The temperature detecting unit 21 includes a constant current circuit 21a configured to supply the temperature detecting diode 12 with constant current and two comparators, a first comparator 21b and a second comparator 21c, configured to compare a voltage between the constant current circuit 21a and the temperature detecting diode 12 with a threshold voltage.

In the above configuration, one end and the other end of the constant current circuit 21a are connected to a power supply voltage source Vcc and the anode of the temperature detecting diode 12, the cathode of which is grounded, respectively.

To the inverting input terminal and the non-inverting input terminal of the first comparator 21b, temperature detection voltage Vf at a connection point between the constant current circuit 21a and the temperature detecting diode 12 and a first threshold voltage Vth1, which is a comparatively low voltage, are input, respectively. The first comparator 21b outputs a first temperature detection signal St1 that becomes a low level when the temperature detection voltage Vf exceeds the first threshold voltage Vth1 and, conversely, becomes a high level when the temperature detection voltage Vf is lower than the first threshold voltage Vth1.

To the inverting input terminal and the non-inverting input terminal of the second comparator 21c, the above-described voltage Vf and a second threshold voltage Vth2, which is higher than the first threshold voltage Vth1 (Vth2>Vth1), are input, respectively. The second comparator 21c outputs a second temperature detection signal St2 that becomes a low level when the temperature detection voltage Vf exceeds the second threshold voltage Vth2 and, conversely, becomes a high level when the temperature detection voltage Vf is lower than the second threshold voltage Vth2.

The driving-capability adjusting unit 22 includes a first OR gate 22a and a second OR gate 22b to one input terminal of each of which a pulse-shaped driving signal Si, which is input from the outside, is input. The second temperature detection signal St2, output from the second comparator 21c in the temperature detecting unit 21, is input to the other input terminal of the first OR gate 22a and the other inverting input terminal of the second OR gate 22b.

The driving-capability adjusting unit 22 also includes a first driving circuit 22c to which output from the first OR gate 22a is input and a second driving circuit 22d to which output from the second OR gate 22b is input. Each of the first driving circuit 22c and the second driving circuit 22d is configured with a p-channel MOSFET the source and the drain of which are connected to a driving power source and the timing adjusting unit 23, respectively. The sizes of the p-channel MOSFETs are set in such a way that the driving capability (driving current) of the second driving circuit 22d to drive the IGBT 11 under high temperature conditions is twice the driving capability (driving current) of the first driving circuit 22c to drive the IGBT 11 under normal conditions.

An example of the timing adjusting unit 23 is, as illustrated in FIG. 2, configured with a delay circuit configured to delay a rise. The timing adjusting unit 23 includes a constant current circuit 23a and an n-channel FET 23b that are connected in series between a control power source Vcc and ground. The gate of the n-channel FET 23b is, via an inverter 23c, connected to an input terminal 23d to which driving current Sdi output from the driving-capability adjusting unit 22 is input.

The timing adjusting unit 23 also includes a charging/discharging capacitor 23e that is connected between a connection point between the constant current circuit 23a and the n-channel FET 23b and ground and a comparator 23f to which terminal voltage Vc across the charging/discharging capacitor 23e is input. To the non-inverting input terminal and the inverting input terminal of the comparator 23f, the terminal voltage Vc across the charging/discharging capacitor 23e and a reference voltage Vref from a variable voltage source 23g are input, respectively. Comparison output Sc of the comparator 23f is supplied to a gate circuit 23h as a gate control signal, and, to the gate circuit 23h, the driving current Sdi, output from the driving-capability adjusting unit 22, is supplied. Output from the gate circuit 23h is output from an output terminal 23i to the gate of the IGBT 11 as driving current.

In the above configuration, the variable voltage source 23g accepts input of the first temperature detection signal St1 and the second temperature detection signal St2, output from the first comparator 21b and the second comparator 21c in the afore-described temperature detecting unit 21, respectively, and outputs three levels of voltage, first reference voltage Vref1, second reference voltage Vref2, and third reference voltage Vref3, the voltage values of which successively increase in this order corresponding to the levels of the temperature detection signals. The first reference voltage Vref1 is, as illustrated in FIG. 3B, set at a voltage that is used for adjusting switching time when the temperature of the semiconductor chip 10 is in a normal temperature range, which covers comparatively low temperatures, and is close to zero. The second reference voltage Vref2 is set at a voltage that is used for adjusting switching time when the temperature of the semiconductor chip 10 is in an intermediate temperature range, which is one level higher than the normal temperature range, and is higher than the first reference voltage Vref1. The third reference voltage Vref3 is set at a voltage that is used for adjusting switching time when the temperature of the semiconductor chip 10 is in a high temperature range, which is one level higher than the intermediate temperature range, and is higher than the second reference voltage Vref2.

Therefore, in the timing adjusting unit 23, when the driving current Sdi, output from the driving-capability adjusting unit 22, is zero, the n-channel FET 23b is brought to an on-state, which causes constant current output from the constant current circuit 23a to flow to ground byway of the n-channel FET 23b, and, in conjunction therewith, the charging/discharging capacitor 23e to be discharged. For this reason, the inter-terminal voltage Vc of the charging/discharging capacitor 23e is, as illustrated in FIG. 3B, kept at zero. Since, in this state, the inter-terminal voltage Vc, supplied to the non-inverting input terminal of the comparator 23f, is lower than the reference voltage Vref1, the comparison output Sc, output from the comparator 23f, is also at a low level, as illustrated in FIG. 3C.

When, in this state, the driving signal Sdi is, as illustrated in FIG. 3A, inverted from a low level to a high level at a point of time t1, the n-channel FET 23b is brought to an off-state in response to the inversion. For this reason, the constant current from the constant current circuit 23a is supplied to the charging/discharging capacitor 23e, which causes charge of the charging/discharging capacitor 23e to be started. Therefore, the inter-terminal voltage Vc of the charging/discharging capacitor 23e increases linearly, as illustrated in FIG. 3B.

At this time, in the normal temperature range where both the first temperature detection signal St1 and the second temperature detection signal St2, output from the temperature detecting unit 21, are at the low level, a reference voltage output from the variable voltage source 23g is set at the first reference voltage Vref1. For this reason, when the inter-terminal voltage Vc of the charging/discharging capacitor 23e has reached the first reference voltage Vref1, the comparison output Sc that becomes a high level at this point of time is output from the comparator 23f, as illustrated by a solid line in FIG. 3C. In other words, the comparison output Sc rises at a point of time that is delayed by a delay time Td1 from a point of time at which the driving current Sdi rose.

In addition, in the intermediate temperature range where the first temperature detection signal St1 and the second temperature detection signal St2, output from the temperature detecting unit 21, are at the high level and the low level, respectively, the reference voltage, output from the variable voltage source 23g, is set at the second reference voltage Vref2. For this reason, when the inter-terminal voltage Vc of the charging/discharging capacitor 23e has reached the second reference voltage Vref2, the comparison output Sc that becomes a high level at this point of time is output from the comparator 23f, as illustrated by a dashed line in FIG. 3C. In other words, the comparison output Sc rises at a point of time that is delayed by a delay time Td2 from the point of time at which the driving current Sdi rose.

Further, in the high temperature range where both the first temperature detection signal St1 and the second temperature detection signal 5t2, output from the temperature detecting unit 21, are at the high level, the reference voltage, output from the variable voltage source 23g, is set at the third reference voltage Vref3. For this reason, when the inter-terminal voltage Vc of the charging/discharging capacitor 23e has reached the third reference voltage Vref3, the comparison output Sc that becomes a high level at this point of time is output from the comparator 23f, as illustrated by an alternate long and short dash line in FIG. 3C. In other words, the comparison output Sc rises at a point of time that is delayed by a delay time Td3 from the point of time at which the driving current Sdi rose.

Since the comparison output Sc, output from the comparator 23f, is supplied to the gate circuit 23h, the gate circuit 23h is opened and the driving current Sdi, which is input to the gate circuit 23h, is output to the gate of the IGBT 11 as timing adjusted driving current Sdia rising timing of which is delayed by any of the delay times Td1 to Td3.

Relationships between variations in the temperature of the semiconductor chip 10 and the driving capability, which is adjusted by the driving-capability adjusting unit 22, and switching times ton when the IGBT 11 is turned on will now be described using FIGS. 4A to 4C. The switching time ton is a time from a point of time at which a driving signal Sd was brought from an on-state to an off-state to a point of time at which the IGBT 11 is turned on and its collector current Ic reaches a predetermined current value.

Figure 4A:
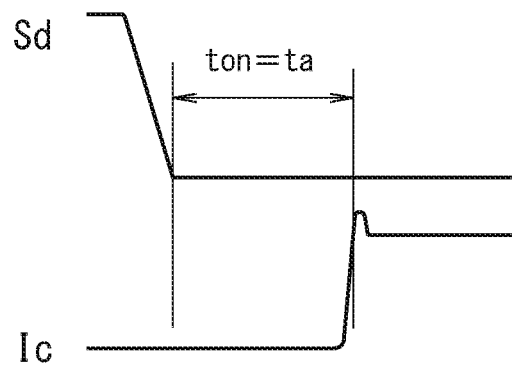
FIGS. 4A to 4C are waveform charts illustrative of switching times when temperature and driving capability of a semiconductor chip are varied.

First, when the temperature of the semiconductor chip 10 is within the normal temperature range and the driving capability is in a poor state, the switching time ton is equal to ta (generally approximately 2 μs), as illustrated in FIG. 4A.

Figure 4B:
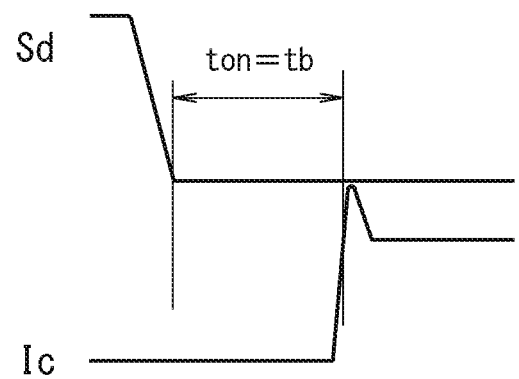

On the other hand, when the temperature of the semiconductor chip 10 has increased to 175° C., which is in a high temperature zone, and the driving capability is in the poor state, the switching time ton is shortened to tb, which is approximately 0.1 μs shorter than that in the case of the normal temperature range, as illustrated in FIG. 4B.

Figure 4C:
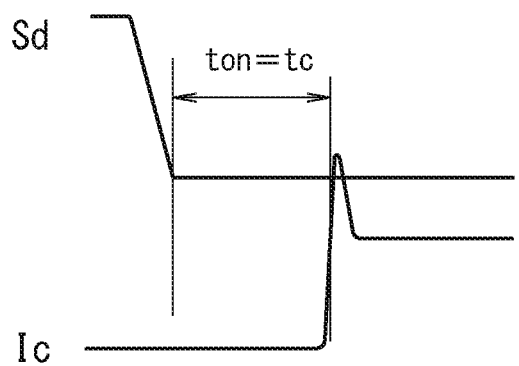

Further, when, while the temperature of the semiconductor chip 10 is kept at 175° C., which is in the high temperature zone, the driving capability is brought to a strong state (is increased to twice the poor driving capability), the switching time ton is further shortened to tc by approximately 0.1 μs, as illustrated in FIG. 4C. As described above, the switching time ton varies depending on the driving capability and the temperature.

For this reason, it is preferable that the delay time Td1, the delay time Td2, and the delay time Td3 be set at a value that enables the switching time ton when the temperature of the semiconductor chip 10 is within the normal temperature range and the driving capability is poor to be maintained, a shortening time Δt1 of the switching time ton when the temperature is within, for example, an intermediate temperature zone (for example, 100° C.≤T<175° C.) before reaching the use limit temperature of the semiconductor chip and the driving capability is poor, and a shortening time Δt2 of the switching time ton when the temperature is 175° C. in the high temperature zone of the semiconductor chip and the driving capability is strong, respectively.

The discharging unit 24 is a unit configured to make the IGBT 11 perform a turn-off operation from an on-state to an off-state. The discharging unit 24 includes a buffer 24a to which the driving signal Sd, input to the IC chip 20, is input via a level shift circuit 26 and an n-channel MOSFET 24b to the gate of which output from the buffer 24a is supplied.

In the above configuration, the drain of the n-channel MOSFET 24b is connected to a connection point between the timing adjusting unit 23 and the gate of the IGBT 11, and the source thereof is grounded. In the discharging unit 24, when the driving signal Sd is inverted from a low level to a high level, the n-channel MOSFET 24b is brought to an on-state, which causes electric charges stored in the gate capacitance of the IGBT 11 to be discharged and the IGBT 11 to perform the turn-off operation.

The alarm circuit 25 outputs an alarm signal Sa when the second temperature detection signal St2 at the high level, which is output from the second comparator 21c in the temperature detecting unit 21 when the temperature of the IGBT 11 reaches the high temperature zone, is input.

Next, an operation of the above-described first embodiment will be described.

When the driving of the IGBT 11 is started while the temperature of the semiconductor chip 10 is in the normal temperature range, where temperature is, for example, lower than 100° C., the semiconductor chip 10 is in a state where the anode side voltage Vf of the temperature detecting diode 12 is at a comparatively high voltage that is higher than the first threshold voltage Vth1. For this reason, both the first temperature detection signal St1 and the second temperature detection signal St2, output from the first comparator 21b and the second comparator 21c in the temperature detecting unit 21, respectively, are at the low level.

Since the second temperature detection signal St2 is input to the OR gates 22a and 22b in the driving-capability adjusting unit 22, a state where the driving signal Sd is at the high level causes the output from both the OR gates 22a and 22b to become a high level, which causes gate driving current to be output neither from the first driving circuit 22c nor the second driving circuit 22d.

On the other hand, in the discharging unit 24, the gate voltage of the n-channel MOSFET 24b being at a high level causes the n-channel MOSFET 24b to be brought to the on-state, which causes the gate capacitance of the IGBT 11 to be discharged and the IGBT 11 to be in the off-state.

When the driving signal Sd is inverted from the high level to the low level while the IGBT 11 is in the off-state, the n-channel MOSFET 24b in the discharging unit 24 is brought to the off-state. At the same time, the output from the OR gate 22a in the driving-capability adjusting unit 22 becomes a low level to cause the p-channel MOSFET in the first driving circuit 22c to be brought to an on-state, which causes the gate driving current Sdi in half amount, which halves the driving capability, to be supplied to the timing adjusting unit 23.

For this reason, in the timing adjusting unit 23, the n-channel FET 23b is inverted from the on-state to the off-state, which causes the charging/discharging capacitor 23e to be started to be charged by the constant current, output from the constant current circuit 23a. For this reason, the inter-terminal voltage Vc of the charging/discharging capacitor 23e starts to increase linearly, as illustrated in FIG. 3B. When the inter-terminal voltage Vc reaches the first reference voltage Vref1, output from the variable voltage source 23g, the comparison output Sc, output from the comparator 23f, is inverted from the low level to the high level, as illustrated in FIG. 3C, and the gate circuit 23h is brought to an open state, which causes the driving current Sdi, output from the first driving circuit 22c in the driving-capability adjusting unit 22, to be supplied to the gate of the IGBT 11 and to charge the gate capacitance.

At this time, gate current flows until the charge of the gate capacitance is completed. Subsequently, when gate voltage of the IGBT 11, after passing through a Miller period, reaches a predetermined threshold voltage, the collector current Ic increases at a large di/dt and, after overshooting a steady current, settles down to the steady current, as illustrated in FIG. 4A. Using the delay time Td1, required for the inter-terminal voltage Vc of the charging/discharging capacitor 23e in the timing adjusting unit 23 at this time to reach the first reference voltage Vref1, the switching time ton at the time of turning on the IGBT 11 is adjusted so as to coincide with approximately 2 µs.

Continuation of the drive of the IGBT 11 causes the IGBT 11 to generate heat and the temperature of the semiconductor chip 10 to rise. In response to the temperature rise, the anode side voltage Vf of the temperature detecting diode 12 falls in inverse proportion to the chip temperature. For this reason, when the temperature of the semiconductor chip 10 reaches the intermediate temperature zone (100° C.≤T<175° C.), the first temperature detection signal St1, output from the first comparator 21b in the temperature detecting unit 21, is inverted from the low level to the high level. The second temperature detection signal St2, output from the second comparator 21c, is, however, kept at the low level.

Therefore, in the driving-capability adjusting unit 22, the driving current Sdi is output from the first driving circuit 22c to the timing adjusting unit 23 in a similar manner to the case where the temperature of the semiconductor chip 10 is in the normal temperature range. In the timing adjusting unit 23, the first temperature detection signal St1 becoming the high level causes the second reference voltage Vref2 to be output from the variable voltage source 23g to the comparator 23f.

For this reason, when the driving signal Sd is inverted from the high level to the low level, the n-channel FET 23b is switched from the on-state to the off-state and the constant current from the constant current circuit 23a causes the charge of the charging/discharging capacitor 23e to start. Therefore, the inter-terminal voltage Vc of the charging/discharging capacitor 23e starts to increase linearly, as illustrated in FIG. 3B.

When the inter-terminal voltage Vc exceeds the first reference voltage Vref1 to reach the second reference voltage Vref2, the comparison output Sc, output from the comparator 23f, becomes the high level. For this reason, the gate circuit 23h is brought to the open state, which causes the driving current Sdi, output from the first driving circuit 22c, to be supplied to the gate of the IGBT 11 and to charge the gate capacitance.

At this time, in response to the rise in the driving current Sdi, the inter-terminal voltage Vc of the charging/discharging capacitor 23e starts to rise. On this occasion, the delay time Td2, required for the inter-terminal voltage Vc to rise from the first reference voltage Vref1 to reach the second reference voltage Vref2, is set at the shortening time Δt1 of the switching time ton due to temperature characteristics of the semiconductor chip 10. For this reason, by offsetting the shortening time Δt1 by the delay time Td2, the switching time ton may be adjusted to a switching time approximately equal to that when the temperature of the semiconductor chip 10 is in the normal temperature range. For this reason, when the semiconductor chip 10 is applied to, for example, an inverter circuit that drives an electric motor, speeding-up of the rotation speed of the electric motor caused by shortened switching time ton is suppressed, which enables variation in the rotation speed to be suppressed.

When the temperature of the semiconductor chip 10 further rises to reach the high temperature zone, where the temperature is not lower than 175° C., the anode side voltage Vf of the temperature detecting diode 12 decreases to a voltage lower than the second threshold voltage Vth2. For this reason, the second temperature detection signal St2, output from the second comparator 21c, is inverted from the low level to the high level. The second temperature detection signal St2 is supplied to the OR gates 22a and 22b in the driving-capability adjusting unit 22. Therefore, the driving signal Sd, which has become the low level, is supplied to the second driving circuit 22d via the OR gate 22b. For this reason, the driving current Sdi providing twice as large driving capability as that from the first driving circuit 22c is output from the second driving circuit 22d to the timing adjusting unit 23.

In the timing adjusting unit 23, since the first temperature detection signal St1 and the second temperature detection signal St2, both of which are at the high level, are input to the variable voltage source 23g, the third reference voltage Vref3, which is the highest among the reference voltages as illustrated in FIG. 3B, is output from the variable voltage source 23g. For this reason, at the point of time t1, at which the driving current Sdi, input from the driving-capability adjusting unit 22, rises, the n-channel FET 23b in the timing adjusting unit 23 is brought to the off-state.

Therefore, the charge of the charging/discharging capacitor 23e by the constant current from the constant current circuit 23a is started. Subsequently, at a point of time at which the inter-terminal voltage Vc of the charging/discharging capacitor 23e reaches the third reference voltage Vref3, the comparison output Sc of the comparator 23f is inverted from the low level to the high level, as illustrated by the alternate long and short dash line in FIG. 3C. Since the comparison output Sc is supplied to the gate circuit 23h, the gate circuit 23h is opened, which causes the driving current Sdi, which is output from the second driving circuit 22d and is input to the gate circuit 23h, to be supplied to the gate of the IGBT 11 and charge the gate capacitance.

At this time, the delay time Td3, generated between the driving current Sdi, input to the timing adjusting unit 23, and the driving current Sdia, output from the timing adjusting unit 23, is set equal to the shortening time Δt2 of the switching time ton illustrated in FIG. 4C when the temperature of the semiconductor chip 10 is in the high temperature zone and the driving capability is set twice that under normal conditions.

For this reason, even under a driving condition in which the temperature of the semiconductor chip 10 is in the high temperature zone and the driving capability is set twice as large, the switching time ton may be set approximately equal to that under a normal driving condition in which the temperature of the semiconductor chip 10 is in a normal temperature zone and the driving capability is half of that under the above driving condition. Therefore, shortening of the switching time ton at the time of turn-on due to a rise in temperature and a rise in driving capability may be suppressed. The suppression enables variation in the rotation speed of an electric motor to be suppressed when the IGBT 11 is applied to an inverter circuit that rotation-drives the electric motor.

Figure 5:
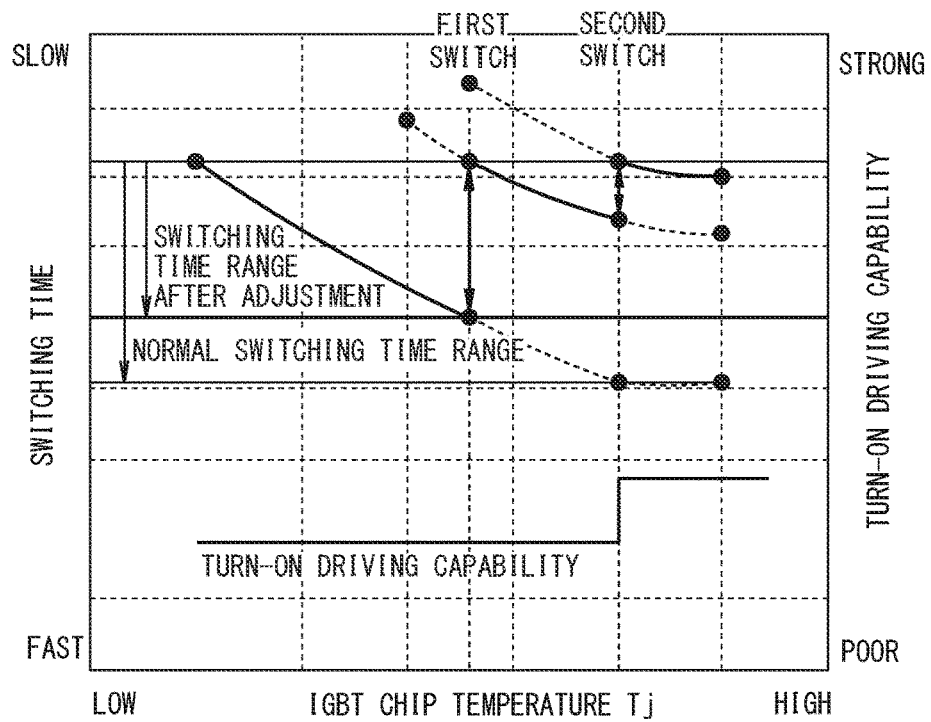
FIG. 5 is a characteristic diagram provided for operational description of the first embodiment.

Summarizing the above, as illustrated in FIG. 5, at points of time at which the delay time Td1 is switched to the delay times Td2 and Td3 successively, the switching time ton may be adjusted to a switching time ton at a base temperature Tb in the normal temperature range, which enables a range of variation in the switching time to be made smaller than a range of variation in the switching time under normal conditions in which no timing adjustment is performed.

As described above, the above-described first embodiment enables optimal delay times Td1 and Td2 corresponding to the shortening times Δt1 and Δt2 of the switching time ton, which varies according to variation in the temperature of the semiconductor chip 10 and variation in the driving capability to drive the IGBT 11 in the semiconductor chip 10, to be set. For this reason, regardless of variation in the temperature of the semiconductor chip 10 and variation in the driving capability for the IGBT 11, the range of variation in the switching time ton may be suppressed. Therefore, variation in the rotation speed of an electric motor may be suppressed when the IGBT 11 is applied to an inverter circuit that rotation-drives the electric motor.

In addition, the above-described first embodiment, in which the timing adjusting unit 23 is configured to be disposed on the output side of the driving-capability adjusting unit 22, enables timing adjustment under a plurality of driving conditions to be performed by use of only one timing adjusting unit 23, which eliminates a necessity of setting up a timing adjusting unit with respect to each driving condition and enables a circuit configuration in the IC chip 20 to be miniaturized.

Figure 6:
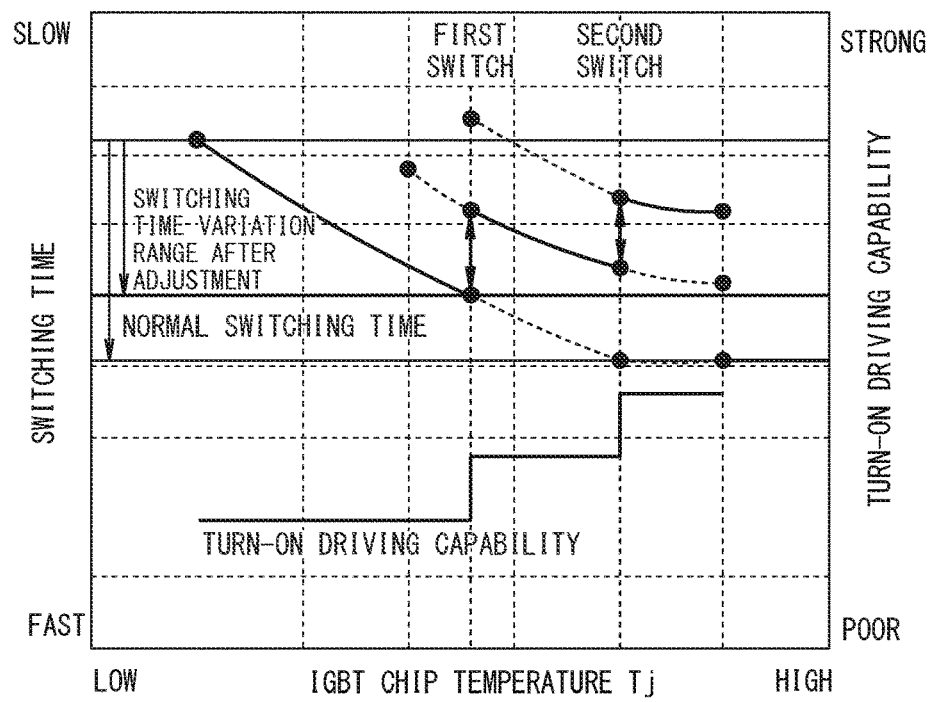
FIG. 6 is a characteristic diagram provided for operational description of a variation of the first embodiment.
Figure 7:
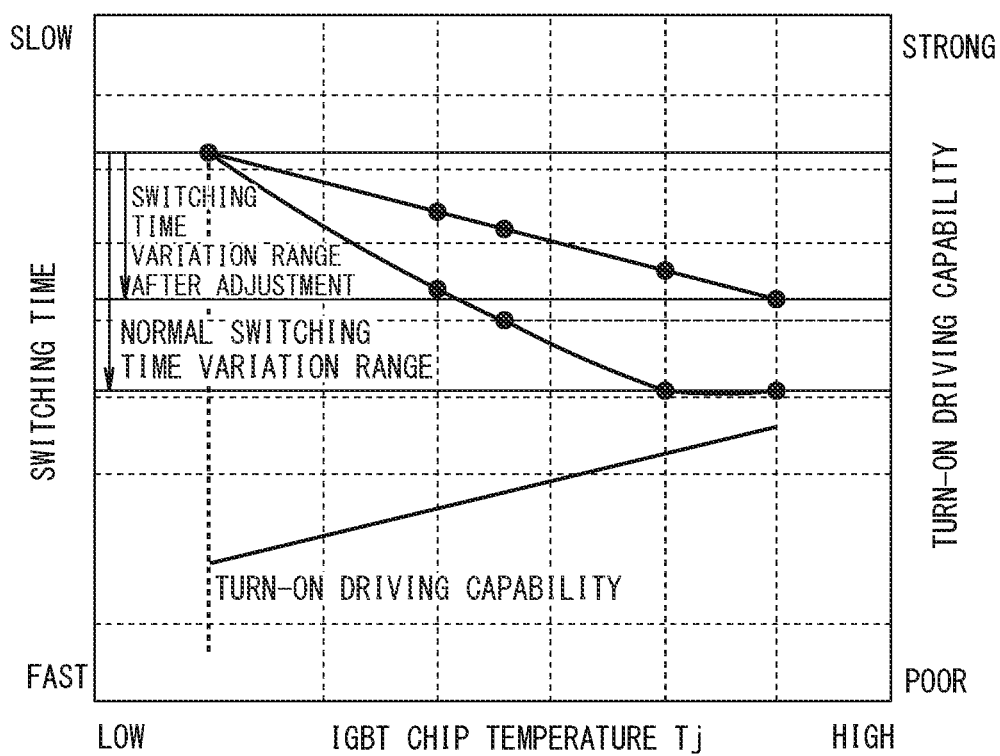
FIG. 7 is a characteristic diagram provided for operational description of another variation of the first embodiment.

Note that, although, in the above-described first embodiment, a case where the driving-capability adjusting unit 22 varied the driving capability at two levels according to variation in the temperature of the semiconductor chip 10 was described, the present invention is not limited to the configuration, and, as illustrated in FIG. 6, the driving capability may be varied at more levels, that is, three or more levels. Alternatively, as illustrated in FIG. 7, varying the driving capability, adjusted by the driving-capability adjusting unit 22, in a continuous manner according to rise in temperature and, according thereto, varying the delay time Td, adjusted by the timing adjusting unit 23, in a continuous manner enable a range of variation in the switching time to be made smaller.

In addition, although, in the above-described first embodiment, a case where, in the timing adjusting unit 23, the delay time was adjusted according to reference voltages supplied to the comparator 23f was described, the present invention is not limited to the configuration. For example, it may be configured such that a plurality of series circuits each having a switch element and a charging/discharging capacitor are connected in parallel with the charging/discharging capacitor 23e, combined capacitance is varied by bringing a required number of switch elements to an on-state according to the levels of the first temperature detection signal St1 and the second temperature detection signal St2 to vary the number of charging/discharging capacitors selected by the switch elements, and the delay time is thereby adjusted.

Next, a second embodiment of the present invention will be described with reference to FIGS. 8 and 9.

The second embodiment is an embodiment in which a timing adjusting unit is configured to be disposed in a driving-capability adjusting unit.

Figure 8:
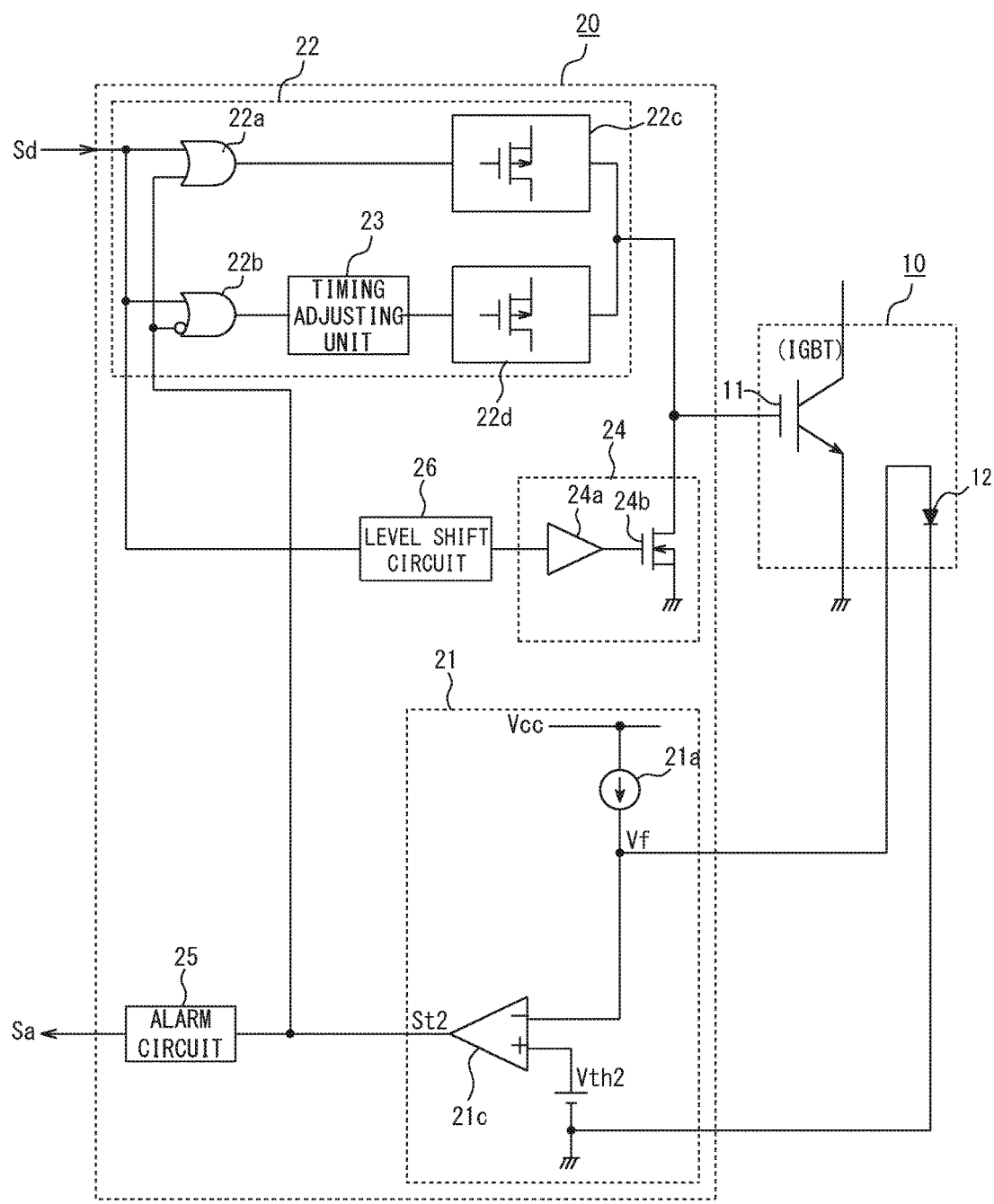
FIG. 8 is a circuit diagram illustrative of a second embodiment of the driving device for semiconductor elements according to the present invention.

In other words, in the second embodiment, as illustrated in FIG. 8, the afore-described timing adjusting unit 23 in the first embodiment is omitted, and, instead thereof, a timing adjusting unit 23 is configured to be disposed between an OR gate 22b in a driving-capability adjusting unit 22 and a second driving circuit 22d.

In addition, a first comparator 21b in a temperature detecting unit 21 is omitted, and a second temperature detection signal St2 output from a second comparator 21c is supplied to only OR gates 22a and 22b in the driving-capability adjusting unit 22.

Figure 9:
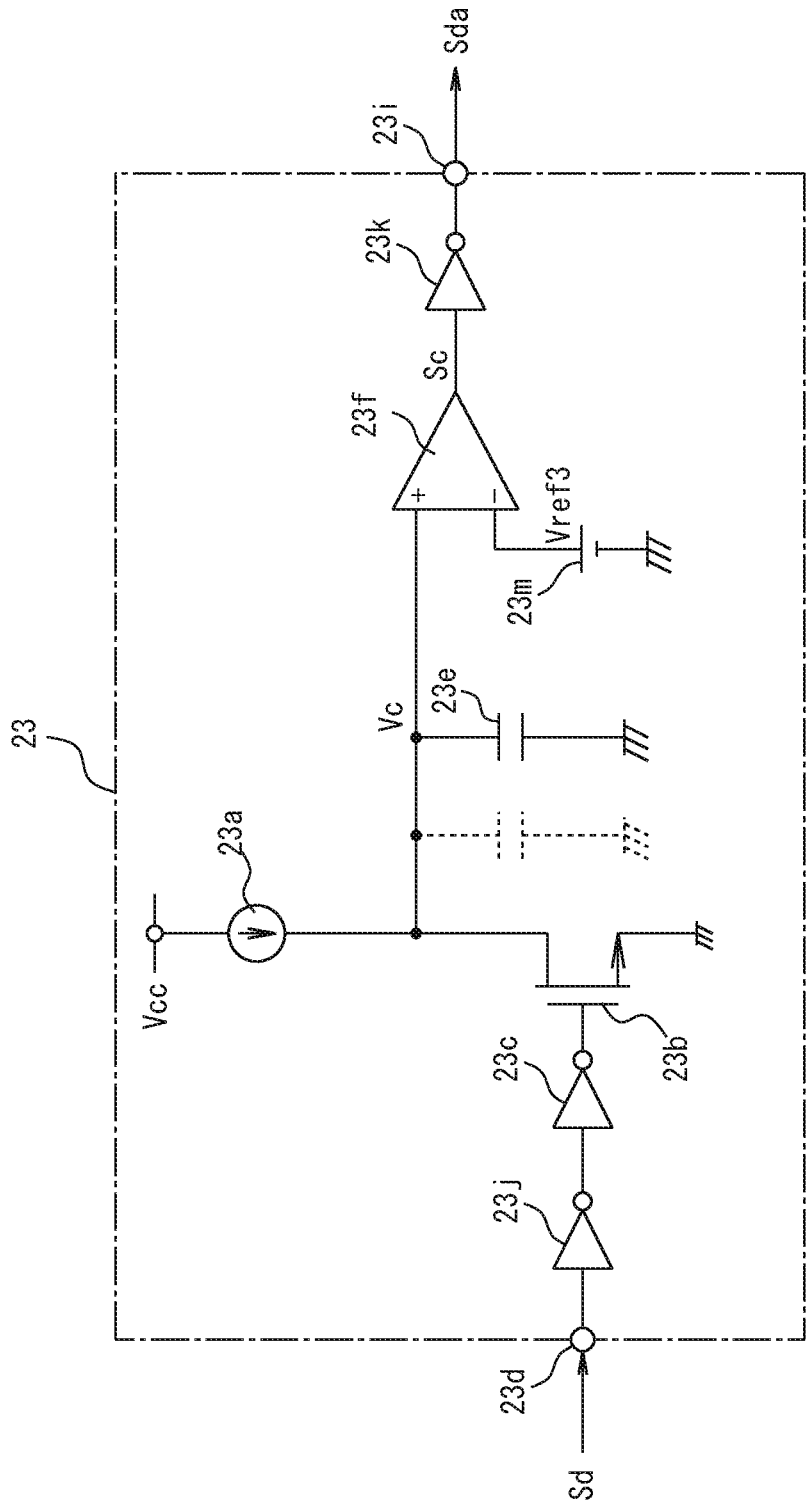
FIG. 9 is a circuit diagram illustrative of an example of a timing adjusting unit applicable to the second embodiment.

Further, the timing adjusting unit 23 is changed as illustrated in FIG. 9. In other words, an inverter 23j is disposed between an input terminal 23d and an inverter 23c. In addition, a variable voltage source 23g in the timing adjusting unit 23 is omitted and, instead thereof, a reference voltage source 23m that supplies a comparator 23f with only a third reference voltage Vref3 is disposed, and a gate circuit 23h is further omitted and comparison output Sc from the comparator 23f is output to an output terminal 23i via an inverter 23k.

According to the second embodiment, since, when the temperature of a semiconductor chip 10 is low, the second temperature detection signal St2, output from the second comparator 21c in the temperature detecting unit 21, is kept at a low level, a first driving circuit 22c is selected in the driving-capability adjusting unit 22 and driving current halving driving capability to drive the IGBT 11 is output from the first driving circuit 22c.

Subsequently, when the temperature of the semiconductor chip 10 rises to reach a high temperature zone, the second temperature detection signal St2, output from the second comparator 21c in the temperature detecting unit 21, becomes a high level to cause the second driving circuit 22d to be selected in the driving-capability adjusting unit 22, which causes driving current providing twice as large driving capability to drive the IGBT 11 to be output from the second driving circuit 22d.

At this time, since the timing adjusting unit 23 is disposed at the previous stage of the driving-capability adjusting unit 22, an n-channel FET 23b is brought from an on-state to an off-state when a driving signal Sd is inverted from a high level to a low level in the timing adjusting unit 23. For this reason, constant current output from a constant current circuit 23a is charged into a charging/discharging capacitor 23e, and inter-terminal voltage Vc thereof increases. Until the inter-terminal voltage Vc reaches the third reference voltage Vref3, the comparison output Sc from the comparator 23f is kept at a low level, and a high level driving signal Sda is output from the output terminal 23i.

When the inter-terminal voltage Vc of the charging/discharging capacitor 23e reaches the third reference voltage Vref3, the comparison output Sc from the comparator 23f becomes a high level and the driving signal Sda after timing adjustment, output from the output terminal 23i, becomes a low level. Therefore, a point of time at which the driving signal Sda, output from the timing adjusting unit 23, is inverted from the high level to the low level is delayed from a point of time at which the driving signal Sd, input to the timing adjusting unit 23, is inverted from the high level to the low level by a delay time Td3.

Since the delayed driving signal Sda is supplied to the second driving circuit 22d, driving current output from the second driving circuit 22d is also delayed with respect to the driving signal Sd by the delay time Td3. The delay time Td3, as described afore, corresponds to a shortening time $\Delta t2$ of switching time ton when the temperature of the semiconductor chip 10 is in the high temperature zone and the driving capability is 1.0, which is twice that under low temperature conditions.

Therefore, the switching time ton required for the second driving circuit 22d to turn on the IGBT 11 may be set approximately equal to the switching time ton required for the first driving circuit 22c to turn on the IGBT 11, which enables the same operational effects to be attained as those attainable when the second driving circuit 22d in the afore-described first embodiment works.

Note that, although, in the above-described first embodiment, a case where the driving-capability adjusting unit 22 was provided with two driving circuits the driving capabilities of which were different from each other was described, the present information is not limited to the configuration. It may be configured such that, by using, for example, a current mirror circuit, driving current supplied to the IGBT 11 is switched.

Although, in the above-described first and second embodiments, a case where the IGBT 11 was formed in the semiconductor chip 10 was described, the present invention is not limited to the configuration, and other types of voltage control type semiconductor elements, such as a power MOSFET, may be applied. Further, without being limited to a Si-based semiconductor element, a wide band gap semiconductor element that is made of at least one of silicon carbide, gallium nitride, and diamond as a main material may also be applied.

REFERENCE SIGNS LIST

10 Semiconductor chip
11 IGBT
12 Temperature detecting diode
20 IC chip
21 Temperature detecting unit
22 Driving-capability adjusting unit
22a, 22b OR gate
22c First driving circuit
22d Second driving circuit
23 Timing adjusting unit
23a Constant current circuit
23b n-channel FET
23c Inverter
23d Input terminal
23e Charging/discharging capacitor
23f Comparator
23g Variable voltage source
23h Gate circuit
23i Output terminal
24 Discharging unit
25 Alarm circuit

The invention claimed is:

1. A driving device for semiconductor elements comprising:
   a semiconductor chip in which a voltage control type semiconductor element is formed;
   a temperature detector configured to detect a temperature of the semiconductor chip;
   a driving-capability adjusting circuit configured to output a signal to adjust a driving capability of the voltage control type semiconductor element based on the temperature detected by the temperature detector; and
   a timing adjusting circuit configured to adjust a switching time of the voltage control type semiconductor element so as to lengthen a delay time of a rise of a driving signal for the voltage control type semiconductor element as the temperature detected by the temperature detector becomes higher.

2. The driving device for semiconductor elements according to claim 1, wherein
   the timing adjusting circuit is connected between the driving-capability adjusting circuit and the voltage control type semiconductor element.

3. The driving device for semiconductor elements according to claim 1, wherein
   the timing adjusting circuit is connected at a previous stage of the driving-capability adjusting circuit.

4. The driving device for semiconductor elements according to claim 1, wherein
   the timing adjusting circuit is configured with a variable delay circuit capable of adjusting delay time based on temperature.

5. The driving device for semiconductor elements according to claim 4, wherein
   the variable delay circuit includes:
   a series circuit of a constant current circuit and a switch element on/off controlled according to input signals;

a charging/discharging capacitor connected between a connection point between the constant current circuit and the switch element and ground; and a comparator configured to take inter-terminal voltage of the charging/discharging capacitor as an input, and compare the inter-terminal voltage with a reference voltage, wherein a reference voltage supplied to the comparator is varied according to the temperature detection values in a stepwise manner or a continuous manner.

6. A driving device for semiconductor elements comprising:

a semiconductor chip in which a voltage control type semiconductor element is formed;

a temperature detector configured to detect a temperature of the semiconductor chip;

a driving-capability adjusting circuit configured to adjust a driving capability of the voltage control type semiconductor element based on the temperature detected by the temperature detector; and a timing adjusting circuit configured to adjust a switching time of the voltage control type semiconductor element based on the temperature detected by the temperature detector, the timing adjusting circuit being configured with a variable delay circuit capable of adjusting a delay time based on temperature.

7. A driving device comprising:

a semiconductor chip having a voltage control type semiconductor element;

a temperature detector configured to detect a temperature of the semiconductor chip;

a driving-capability adjusting circuit configured to adjust a driving capability of the voltage control type semiconductor element in response to the temperature detected by the temperature detector; and a timing adjusting circuit configured to suppress a variation of a switching time of the voltage control type semiconductor element in response to the detected temperature and the adjusted driving capability.

* * * * *